US007200552B2

(12) United States Patent
Chu et al.

(10) Patent No.: US 7,200,552 B2
(45) Date of Patent: Apr. 3, 2007

(54) GRADIENT DESCENT OPTIMIZATION OF LINEAR PREDICTION COEFFICIENTS FOR SPEECH CODERS

(75) Inventors: Wai C. Chu, San Jose, CA (US); Khosrow Lashkari, Freemont, CA (US)

(73) Assignee: NTT DoCoMo, Inc., Tokyo (JP)

( * ) Notice: Subject to any disclaimer, the term of this patent is extended or adjusted under 35 U.S.C. 154(b) by 816 days.

(21) Appl. No.: 10/134,281

(22) Filed: Apr. 29, 2002

(65) Prior Publication Data

US 2003/0204402 A1 Oct. 30, 2003

(51) Int. Cl.
*G10L 19/12* (2006.01)

(52) U.S. Cl. ..................... 704/219; 704/220
(58) Field of Classification Search ........... 704/219, 704/220
See application file for complete search history.

(56) References Cited

U.S. PATENT DOCUMENTS

| | | | | |
|---|---|---|---|---|
| 4,989,170 A | * | 1/1991 | Batruni et al. | 708/322 |
| 5,058,047 A | * | 10/1991 | Chung | 708/322 |
| 5,822,721 A | * | 10/1998 | Johnson et al. | 704/219 |

OTHER PUBLICATIONS

Manfred R. Schroeder and Bishnu S. Atal, "Code-Excited Linear Prediction (CELP): High-Quality Speech At Very Low Bit Rates," Mar. 26-29, 1985, pp. 937 through 940.
Alan V. McCree and Thomas P. Barnwell III, "A Mixed Excitation LPC Vocoder Model for Low Bit Rate Speech Coding," Jul. 1995, pp. 242 through 250.

B.S. Atal and Suzanne L. Hanauer, "Speech Analysis and Synthesis by Linear Prediction of the Speech Wave," Apr. 1971, pp. 637 through 655.
Bishnu S. Atal and Joel R. Remde, "A New Model of LPC Excitation For Producing Natural-Sounding Speech At Low Bit Rates," 1982, pp. 614 through 617.
G. Fant, "The Acoustics of Speech," 1959, pp. 17 through 30.
Yining Chen et al., "*A New Algorithm For Parameter Re-optimization in Multi-Pulse Excitation LP Synthesizer*", IEEE Asia-Pacific Conf. On Circuits and Systems, Dec. 4-6, 2000, pp. 560-563.
M. Fratti, et al., "*An Approach to Parameter Reoptimization in Multipulse-Based Coders*", IEEE Transactions on Speech and Audio Processing, IEEE Inc. New York, vol. 1, No. 4, (Oct. 1, 1993) pp. 463-465.
James C. Richards, et al., "*A Gradient-Based Variable Step-Size LMS Algorithm*", Proceedings of Southeastcon. Williamsburg, Apr. 7-10, 1991, Proceedings of the Southeast Conference, New York, IEEE, US, vol. 1, (Apr. 7, 1991), pp. 1083-1087.
Steven T. Smith, "*Linear and Nonlinear Conjugate Gradient Methods For Adaptive Processing*", Proc. IEEE Int. Conf. On Speech and Signal Processing, vol. 3, May 7-10, 1996, pp. 1835-1838.
International Search Report from corresponding EPO Application No. 03 007 987.5, dated Sep. 1, 2003, 2p.

* cited by examiner

*Primary Examiner*—Daniel Abebe
(74) *Attorney, Agent, or Firm*—Blakely, Sokoloff, Taylor & Zafman LLP (57) ABSTRACT

An optimization algorithm is provided for linear prediction based speech coding systems. The optimization algorithm minimizes the error between original speech samples and synthesized speech samples. Optimized linear prediction coefficients are computed directly from a system difference equation without converting the coefficients into the root-domain.

19 Claims, 4 Drawing Sheets

GRADIENT DESCENT OPTIMIZATION OF LINEAR PREDICTION COEFFICIENTS FOR SPEECH CODERS

BACKGROUND

The present invention relates generally to speech encoding, and more particularly, to optimizing linear prediction coefficients.

Speech coding (or compression) is a well known technology for encoding speech into digital data for transmission to a receiver which then reproduces the speech. The digitally encoded speech data can also be stored in a variety of digital media between encoding and later decoding (i.e., reproduction) of the speech.

Speech coding systems differ from other analog and digital encoding systems that directly sample an acoustic sound at high bit rates and transmit the raw sampled data to the receiver. Direct sampling systems usually produce a high quality reproduction of the original acoustic sound and is typically preferred when quality reproduction is especially important. Common examples where direct sampling systems are usually used include music phonographs and cassette tapes (analog) and music compact discs and DVDs (digital). One disadvantage of direct sampling systems, however, is the large bandwidth required for transmission of the data and the large memory required for storage of the data. Thus, for example, in a typical encoding system which transmits raw speech data sampled from an original acoustic sound, a data rate as high as 128,000 bits per second is often required.

In contrast, speech coding systems use a mathematical model of human speech production. The fundamental techniques of speech modeling are known in the art and are described in B. S. Atal and Suzanne L. Hanauer, *Speech Analysis and Synthesis by Linear Prediction of the Speech Wave*, The Journal of the Acoustical Society of America, 637–55 (vol. 50 1971). The model of human speech production used in speech coding systems is usually referred to as the source-filter model. Generally, this model includes an excitation signal which represents the pulsed air flow produced by the lungs and the vocal folds, and a synthesis filter which represents the vocal tract (i.e., the glottis, mouth, tongue, nasal cavities and lips). Therefore, the excitation signal acts as an input signal to the synthesis filter similar to the way the lungs and the vocal folds produce pulsed air flow to the vocal tract. The synthesis filter then alters the excitation signal to represent the way the vocal tract manipulates the pulsed air flow from the lungs and the vocal folds. Thus, the resulting synthesized speech signal becomes an approximate representation of the original speech.

One advantage of speech coding systems is that the bandwidth needed to transmit a digitized form of the original speech can be greatly reduced compared to direct sampling systems. Thus, by comparison, whereas direct sampling systems transmit raw acoustic data to describe the original sound, speech coding systems transmit only a limited amount of control data needed to recreate the mathematical speech model. As a result, a typical speech coding system can reduce the bandwidth needed to transmit speech to between about 2,400 to 8,000 bits per second.

One problem with speech coding systems, however, is that the quality of the reproduced speech is sometimes relatively poor compared to direct sampling systems. Most speech coding systems provide sufficient quality for the receiver to accurately perceive the content of the original speech. However, in some speech coding systems, the reproduced speech is not transparent. That is, while the receiver can understand the words originally spoken, the quality of the speech may be poor or annoying. Thus, a speech coding system that provides a more accurate speech production model is desirable.

One solution that has been recognized for improving the quality of speech coding systems is described in U.S. patent application Ser. No. 09/800,071 to Lashkari et al., hereby incorporated by reference. Briefly stated, this solution involves minimizing a synthesis error between an original speech sample and a synthesized speech sample. One difficulty that was discovered in that speech coding system, however, is the highly nonlinear nature of the synthesis error, which made the problem mathematically ill-behaved. This difficulty was overcome by solving the problem using the roots of the synthesis filter polynomial instead of coefficients of the polynomial. Accordingly, a root optimization algorithm is described therein for finding the roots of the synthesis filter polynomial.

One remaining problem with the above-mentioned solution, and with other optimization solutions known to the art, is the large amount of computational power that is required to encode the original speech. As those skilled in the art well know, a central processing unit ("CPU") or a digital signal processor ("DSP") must be used by speech coding systems to calculate the various mathematical formulas used to code the original speech. Oftentimes, when speech coding is performed by a mobile unit, such as a mobile phone, the CPU or DSP is powered by an onboard battery. Thus, the computational capacity available for encoding speech is usually limited by the speed of the CPU or DSP or the capacity of the battery. Although this problem is common in all speech coding systems, it is especially significant in systems that use optimization algorithms. Typically, optimization algorithms provide higher quality speech by including extra mathematical computations in addition to the standard encoding algorithms. However, inefficient optimization algorithms require more expensive, heavier and larger CPUs and DSPs which have greater computational capacity. Inefficient optimization algorithms use more battery power, which results in shortened battery life. Therefore, an efficient optimization algorithm is desired for speech coding systems.

BRIEF SUMMARY

Accordingly, an algorithm is provided for optimizing the mathematical model of human speech production. The optimization algorithm computes coefficients of a synthesis filter polynomial without using convolution and without converting the coefficients into the root domain. Thus, computational efficiency associated with optimization of the coefficients is improved. The coefficients are computed directly from the system difference equation using a gradient of the error between the original speech and the synthesized speech. A termination threshold is used to test for system instability, and if instability is identified, the optimization algorithm is ended and the last coefficients are returned.

BRIEF DESCRIPTION OF SEVERAL VIEWS OF DRAWINGS

The invention, including its construction and method of operation, is illustrated more or less diagrammatically in the drawings, in which.

DESCRIPTION

Figure 1:
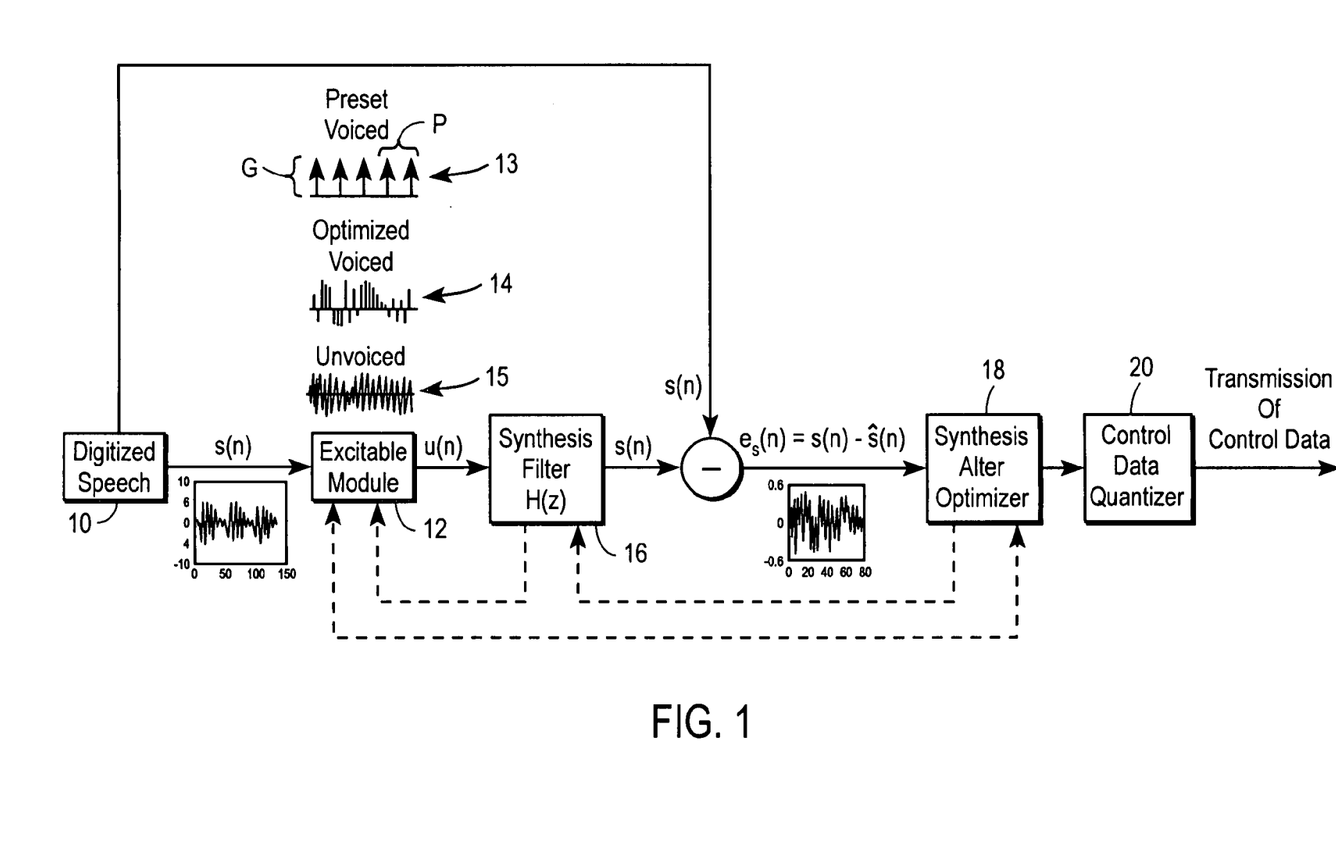
FIG. 1 is a block diagram of a speech analysis-by-synthesis system.

Referring to the drawings, and particularly to FIG. 1, a speech coding system is provided that minimizes the synthesis error in order to more accurately model the original speech. In FIG. 1, an analysis-by-synthesis ("AbS") system is shown which is commonly referred to as a source-filter model. As is well known in the art, source-filter models are designed to mathematically model human speech production. Typically, the model assumes that the human sound-producing mechanisms that produce speech remain fixed, or unchanged, during successive short time intervals, or frames (e.g., 10 to 30 ms analysis frames). The model further assumes that the human sound producing mechanisms can change between successive intervals. The physical mechanisms modeled by this system include air pressure variations generated by the vocal folds, glottis, mouth, tongue, nasal cavities and lips. Thus, the speech decoder reproduces the model and recreates the original speech using only a small set of control data for each interval. Therefore, unlike conventional sound transmission systems, the raw sampled date of the original speech is not transmitted from the encoder to the decoder. As a result, the digitally encoded data that is actually transmitted or stored (i.e., the bandwidth, or the number of bits) is much less than those required by typical direct sampling systems.

Accordingly, FIG. 1 shows an original digitized speech 10 delivered to an excitation module 12. The excitation module 12 then analyzes each sample s(n) of the original speech and generates an excitation function u(n). The excitation function u(n) is typically a series of pulses that represent air bursts from the lungs which are released by the vocal folds to the vocal tract. Depending on the nature of the original speech sample s(n), the excitation function u(n) may be either a voiced 13, 14, or an unvoiced signal 15.

One way to improve the quality of reproduced speech in speech coding systems involves improving the accuracy of the voiced excitation function u(n). Traditionally, the excitation function u(n) has been treated as a series of pulses 13 with a fixed magnitude G and period P between the pitch pulses. As those in the art well know, the magnitude G and period P may vary between successive intervals. In contrast to the traditional fixed magnitude G and period P, it has previously been shown to the art that speech synthesis can be improved by optimizing the excitation function u(n) by varying the magnitude and spacing of the excitation pulses 14. This improvement is described in Bishnu S. Atal and Joel R. Remde, *A New Model of LPC Excitation For Producing Natural-Sounding Speech At Low Bit Rates*, IEEE International Conference On Acoustics, Speech, And Signal Processing 614–17 (1982). This optimization technique usually requires more intensive computing to encode the original speech s(n). However, in prior systems, this problem has not been a significant disadvantage since modern computers usually provide sufficient computing power for optimization 14 of the excitation function u(n). A greater problem with this improvement has been the additional bandwidth that is required to transmit data for the variable excitation pulses 14. One solution to this problem is a coding system that is described in Manfred R. Schroeder and Bishnu S. Atal, *Code-Excited Linear Prediction (CELP): High-Quality Speech At Very Low Bit Rates*, IEEE International Conference On Acoustics, Speech, And Signal Processing, 937–40 (1985). This solution involves categorizing a number of optimized excitation functions into a library of functions, or a codebook. The encoding excitation module 12 will then select an optimized excitation function from the codebook that produces a synthesized speech that most closely matches the original speech s(n). Next, a code that identifies the optimum codebook entry is transmitted to the decoder. When the decoder receives the transmitted code, the decoder then accesses a corresponding codebook to reproduce the selected optimal excitation function u(n).

The excitation module 12 can also generate an unvoiced 15 excitation function u(n). An unvoiced 15 excitation function u(n) is used when the speaker's vocal folds are open and turbulent air flow is passed through the vocal tract. Most excitation modules 12 model this state by generating an excitation function u(n) consisting of white noise 15 (i.e., a random signal) instead of pulses.

Next, the synthesis filter 16 models the vocal tract and its effect on the air flow from the vocal folds. Typically, the synthesis filter 16 uses a polynomial equation to represent the various shapes of the vocal tract. The parameters, or coefficients, of the polynomial equation are normally estimated using the input speech signal and are usually referred to as linear prediction coefficients.

According to Atal and Remde, supra., the synthesis filter 16 can be represented by the mathematical formula:

$$H(z) = G/A(z) \tag{1}$$

where G is a gain term representing the loudness of the voice (the gain term G is removed from the remaining formulas for simplicity). A(z) is a polynomial of order M and can be represented by the formula:

$$A(z) = 1 + \sum_{i=1}^{M} a_i z^{-1} \tag{2}$$

The order of the polynomial A(z) can vary depending on the particular application, but a 10th order polynomial is commonly used with an 8 kHz sampling rate. The relationship of the synthesized speech ŝ(n) to the excitation function u(n) as determined by the synthesis filter 16 can be defined by the formula:

$$\hat{s}(n) = u(n) - \sum_{i=1}^{M} a_i \hat{s}(n-i) \tag{3}$$

Formula (3) may also be referred to as the system difference equation.

Conventionally, the coefficients $a_1 \ldots a_M$ of this plynomial are computed using a technique known in the art as linear predictive coding ("LPC"). LPC-based techniques compute the polynomial coefficients $a_1 \ldots a_M$ by minimizing the total prediction error $E_p$. Accordingly, the sample prediction error $e_p(n)$ is defined by the formula:

$$e_p(n) = s(n) + \sum_{i=1}^{M} a_i s(n-i) \quad (4)$$

The total prediction error $E_p$ is then defined by the formula:

$$E_p = \sum_{i=0}^{N-1} e_p^2(i) \quad (5)$$

where N is the length of the analysis frame expressed in number of samples. The polynomial coefficients $a_1 \ldots a_M$ can now be computed by minimizing the total prediction error $E_p$ using well known mathematical techniques.

One problem with the LPC technique of computing the polynomial coefficients $a_1 \ldots a_M$ is that only the total prediction error is minimized. Thus, the LPC technique does not minimize the error between the original speech s(n) and the synthesized speech ŝ(n). Accordingly, the sample synthesis error $e_s(n)$ can be defined by the formula:

$$e_s(n) = s(n) - \hat{s}(n) \quad (6)$$

The total synthesis error $E_s$, also referred to as the synthesis error energy J, can then be defined by the formula:

$$J = E_s = \sum_{n=0}^{N-1} e_s^2(n) = \sum_{n=0}^{N-1} (s(n) - \hat{s}(n))^2 \quad (7)$$

where as before, N is the length of the analysis frame in number of samples. Like the total prediction error $E_p$ discussed above, the synthesis error energy J should be minimized to compute the optimum filter coefficients $a_1 \ldots a_M$. However, one difficulty with this technique is that the synthesized speech ŝ(n), as represented in formula (3), makes the synthesis error energy J a highly nonlinear function that is not generally well-behaved mathematically.

Some optimization algorithms have avoided this difficulty by using the roots of the polynomial A(z) instead of the coefficients $a_1 \ldots a_M$. While providing control over the stability of the synthesis filter 16, this solution requires a significant amount of computational capacity. In addition, root-domain optimization generally computes a gradient based on the impulse response associated with convolution. Thus, the convolution only finds the zero state response of the system without taking into account the history of prior speech samples.

In contrast to other optimization algorithms, the gradient of the synthesis error energy J may be computed directly to optimize the filter coefficients $a_1 \ldots a_M$ without converting them into the root-domain. Accordingly, using formulas (3), (6) and (7), the gradient of the synthesis error energy J can be represented by the formula:

$$\frac{\partial J}{\partial a_i} = \sum_{n=0}^{N-1} \frac{\partial}{\partial a_i}(s[n] - \hat{s}[n])^2 = \sum_{n=0}^{N-1} 2(s[n] - \hat{s}[n])\left(-\frac{\partial \hat{s}[n]}{\partial a_i}\right) \quad (8)$$

where i=1 to M. Using formula (3), the gradient of the synthesized speech with respect to the coefficients $a_1 \ldots a_M$ can now be expressed by the formula:

$$\frac{\partial \hat{s}[n]}{\partial a_i} = -\sum_{j=1}^{M} a_j \frac{\partial \hat{s}[n-j]}{\partial a_j} - \hat{s}[n-i] \quad (9)$$

where n=0 to N−1 and i=1 to M. It is assumed that the coefficients $a_1 \ldots a_M$ are valid for only one frame of length N. Thus, the coefficients exist only from n=0 to N−1, and outside this interval, the speech is independent of the coefficients $a_1 \ldots a_M$.

One advantage of the optimization algorithm is that the partial derivatives of the synthesized speech shown in formula (9) can be efficiently computed in a recursive manner. Accordingly, the partial derivatives of formula (9) may be defined by a two dimensional array denoted by the formula:

$$D[n, i] = \frac{\partial \hat{s}[n]}{\partial a_i} \quad (10)$$

where n=0 to N−1 and i=1 to M. The array D[n,i] can now be computed using the following iterative code:

```
For n=1 to N-1                                    (11)
    D[n, i] = -ŝ[n-i]
    For j = 1 to M
        If n-j = 0
            D[n, i] = -a_j * D[n-j, i]
    Next j
Next n
```

The partial derivatives computed using the iterative code (11) can then be substituted into formula (8) to obtain the gradient of the synthesis error energy.

The gradient vector of the synthesis error energy can now be defined by the formula:

$$\nabla J = \begin{bmatrix} \frac{\partial J}{\partial a_1} & \frac{\partial J}{\partial a_2} & \cdots & \frac{\partial J}{\partial a_M} \end{bmatrix}^T \quad (12)$$

The vector of the coefficients $a_1 \ldots a_M$ can also be defined by the formula:

$$a = [a_1 \ a_2 \ \ldots \ a_M]^T \quad (13)$$

The optimized coefficients can then be computed using the formula:

$$a_{new} = a - \mu \nabla J \quad (14)$$

where μ is a positive value known as the step size. Thus, new vectors of the coefficients are calculated by displacing the vector in a negative direction to the gradient. The magnitude of the step size μ may be increased or decreased to change the speed and stability of the optimization process.

Figure 2:
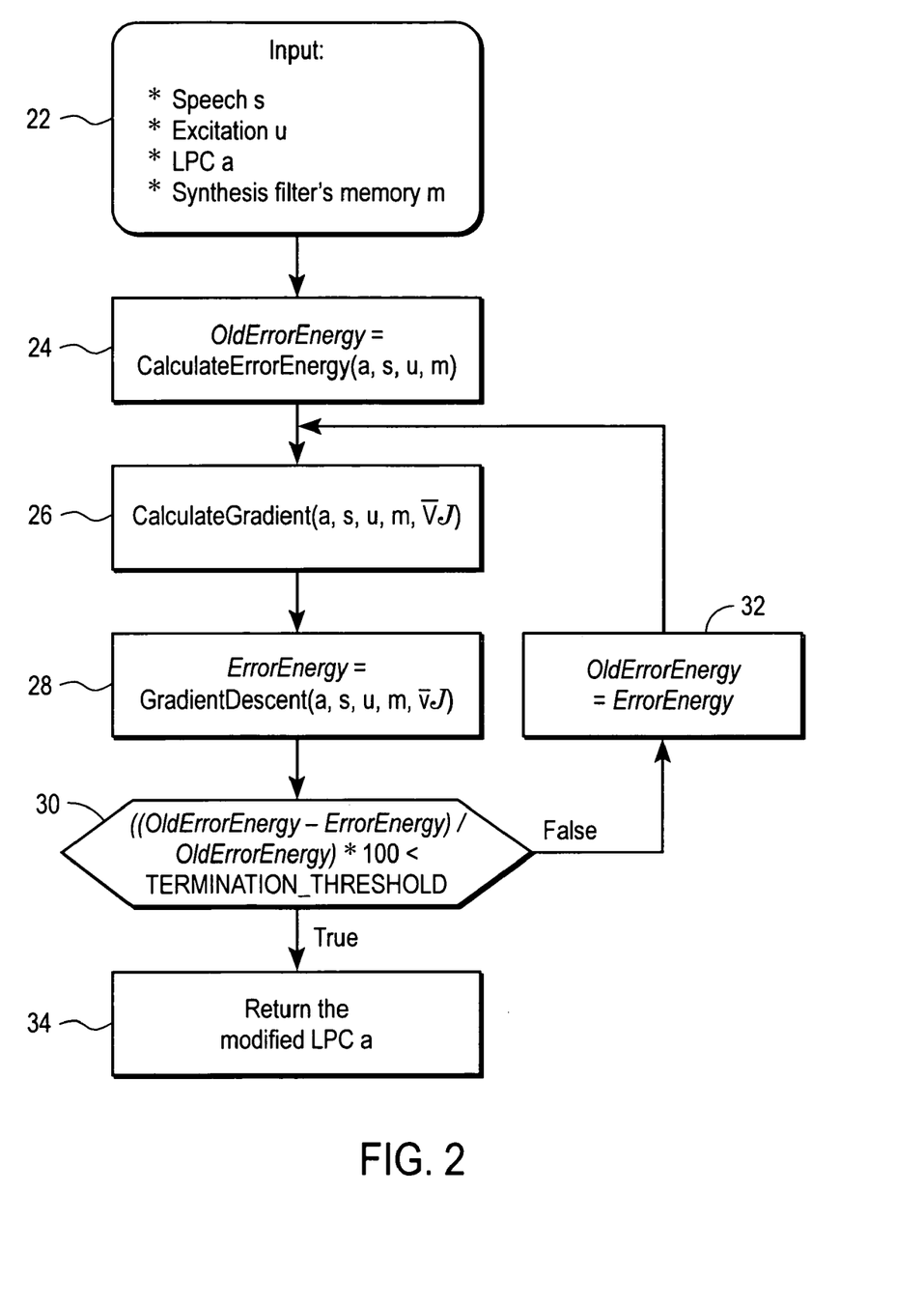
FIG. 2 is a flow chart of the optimization algorithm for filter coefficients.
Figure 3:
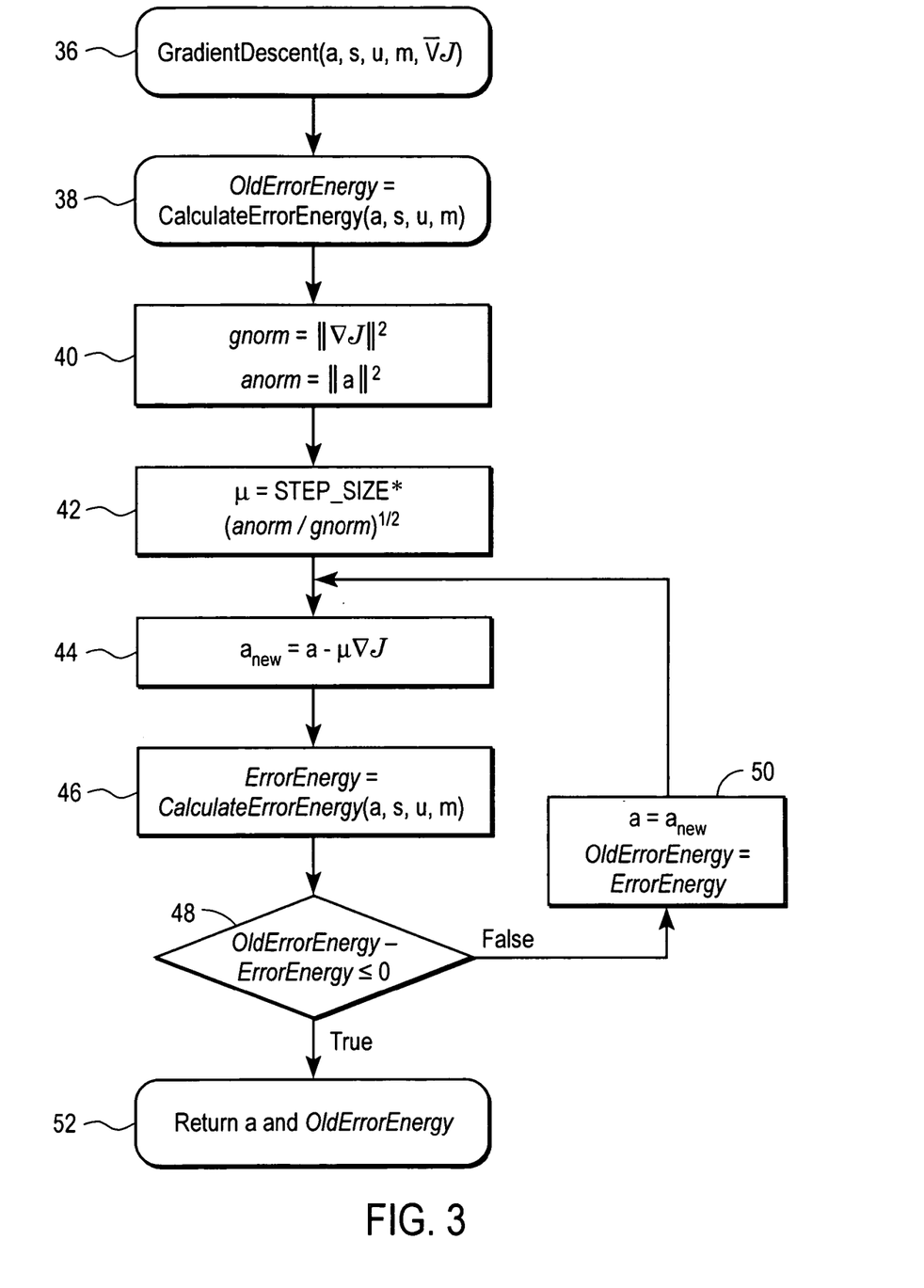
FIG. 3 is a flow chart of a gradient descent function, used by the optimization algorithm to find the error gradient.

Flow charts that may be used with the optimization algorithm are shown in FIGS. 2 and 3. In FIG. 2, the inputs for the optimization algorithm are the original speech s, the excitation function u, the linear prediction coefficients $a_1 \ldots a_M$, and the memory of the synthesis filter; 22. The synthesis error energy J is then computed using formula (7) by invoking the CalculateErrorEnergy function; 24. The variable OldErrorEnergy is then initialized by setting it equal to the synthesis error energy J; 24. The gradient of the synthesis error energy is computed next using formula (8) or iterative code (11) by invoking the CalculateGradient function; 26.

The variable ErrorEnergy is now computed by invoking the GradientDescent function, which is shown in FIG. 3 and described below; 28. The variable Error Energy represents the synthesis error energy J using updated coefficients $a_1 \ldots a_M$, while the variable OldErrorEnergy represents the synthesis error energy using the previous coefficients $a_1 \ldots a_M$. Next, ErrorEnergy is compared to OldErrorEnergy to determine if the change in the synthesis error energy J is less than the preset value Termination_Threshold; 30. If the change in the synthesis error energy J is not less than the Termination_Threshold, OldErrorEnergy is set equal to ErrorEnergy and a new gradient of the synthesis error energy J, new coefficients $a_1 \ldots a_M$, and a new synthesis error energy J are computed; 32, 26, 28. If the change in the synthesis error energy is less than the Termination_Threshold, the optimization algorithm is ended and the modified linear prediction of coefficients are returned; 34.

In FIG. 3, the GradientDescent function is shown; 36. The GradientDescent function begins by computing the synthesis error energy J using formula (7) by invoking the CalculateErrorEnergy function; 38. The variable OldErrorEnergy is then set equal to the synthesis error energy J; 38. Next, the magnitude of the synthesis error energy gradient vector for $\nabla J$ is computed and assigned to the variable gnorm, and the magnitude of the coefficients $a_1 \ldots a_M$ is computed and assigned to the variable anorm; 40. The variables anorm, gnorm, and a preset value assigned to the variable Step_Size are used to compute an adaptive step size $\mu$; 42. New linear prediction coefficients $a_{new}$ are now computed using formula (14); 44. The synthesis error energy J is then computed using formula (7) by invoking the CalculateErrorEnergy function; 46. The variable ErrorEnergy is then set equal to the synthesis error energy J; 46. Next, the OldErrorEnergy is compared to the ErrorEnergy to determine if the synthesis error energy J has decreased or increased; 48. If the synthesis error energy J decreases, the variable OldErrorEnergy is set equal to the value of the ErrorEnergy variable, and the linear prediction coefficients $a_1 \ldots a_M$ are updated to the new linear prediction coefficients $a_{new}$; 50. New coefficients $a_{new}$ and the synthesis error energy J are then recomputed; 44, 46. On the other hand, if the synthesis error energy J increases, the GradientDescent function is stopped and the current linear prediction coefficients $a_1 \ldots a_M$ and OldErrorEnergy are returned.

Once the synthesis model is completely determined and the coefficients $a_1 \ldots a_M$ have been optimized, the control data for the model are quantized into digital data for transmission or storage. Many different industry standards exist for quantization. However, in one example, the control data that are quantized include ten synthesis filter coefficients $a_1 \ldots a_M$, one gain value G for the magnitude of the excitation pulses, one pitch period value P for the frequency of the excitation pulses, and one indicator for a voiced 13 or unvoiced 15 excitation function u(n). Accordingly, the described example requires the transmission of thirteen different variables at the end of each speech frame. However, other control data may also be transmitted if so desired. For example, in CELP encoders, a codebook index is also included which identifies the optimized excitation function u(n) to be used. Commonly, in CELP encoders, the control data are quantized into a total of 80 bits. Thus, according to this example, the synthesized speech ŝ(n), including optimization, can be transmitted within a bandwidth of 8,000 bits/s (80 bits/frame÷0.010 s/frame).

Additional encoding sequences are also possible for improving the accuracy of the synthesis model depending on the computing capacity available for encoding. Some of these alternative sequences are demonstrated in FIG. 1 by dashed routing lines. For example, the excitation function u(n) can be reoptimized at various stages during encoding of the synthesis model. Furthermore, the formulas and algorithms may be altered or rearranged to suit particular applications.

One method of further improving the subjective quality of the synthesized speech is to incorporate perceptual weighting. Accordingly, the synthesis error energy J can be defined with perceptual weighting by the formula:

$$J = \sum_{n=0}^{N-1} \{e(n) * h_w[n]\}^2 = \sum_{n=0}^{N-1} \{(s[n] - \hat{s}[n]) * h_w[n]\}^2 \quad (15)$$

where $h_w[n]$ is the impulse response of the perceptually weighted filter.

By performing a convolution operation on formula (15), the synthesis error energy can be represented by the formula:

$$J = \sum_{n=0}^{N-1} \left\{ \sum_{k=0}^{n} h_w[k]s[n-k] - \sum_{l=0}^{n} h_w[l]\hat{s}[n-l] \right\}^2 \quad (16)$$

$$= \sum_{n=0}^{N-1} \left\{ \left( \sum_{k=0}^{n} h_w[k]s[n-k] \right)^2 - 2\left( \sum_{k=0}^{n} h_w[k]s[n-k] \right) \right.$$

$$\left. \left( \sum_{l=0}^{n} h_w[l]\hat{s}[n-l] \right) + \left( \sum_{l=0}^{n} h_w[l]\hat{s}[n-l] \right)^2 \right\}$$

Next, by differentiating formula (16) with respect to the synthesis filter coefficients $a_1 \ldots a_M$, the partial derivative of the synthesis error energy can now be represented by the formula:

$$\frac{\partial J}{\partial a_i} = \quad (17)$$

$$\sum_{n=0}^{N-1} \left\{ -2\left( \sum_{k=0}^{n} h_w[k](s[n-k] - \hat{s}[n-k]) \right) \left( \sum_{l=0}^{n} h_w[l] \frac{\partial}{\partial a_i} \hat{s}[n-l] \right) \right\}$$

The perceptually weighted error can also be defined by the formula:

$$e_w[n] = e[n] * h_w[n] \quad (18)$$

Using formulas (10), (15), (17) and (18), the partial derivative of the synthesis error energy can now be represented by the formula:

$$\frac{\partial J}{\partial a} = \sum_{n+0}^{N-1} \{-2e_w[n](D[n,i] * h_w[n])\} \quad (19)$$

Accordingly, the optimization algorithm may be further improved by using formula (15) in place of formula (7) and using formula (19) in place of formula (8).

It is now apparent to those skilled in the art that the described optimization algorithm significantly reduces the number of calculations required to optimize the synthesis filter polynomial A(z). Thus, the efficiency of the encoder is greatly improved. Alternatively, the increased efficiency may be used to improve the quality of the synthesized speech ŝ(n). Using previous optimization algorithms, the computation of the synthesized speech ŝ(n) for each sample was a computationally intensive task. However, the improved optimization algorithm reduces the computational load required to compute the synthesized speech ŝ(n) by computing the gradient of the synthesis error energy J directly from the system difference equation without converting to the root-domain. Although the invention may be used in a variety of speech encoders, one speech encoder in which improved performance has already been noted is the speech encoder described in U.S. Pat. No. 6,859,775B2 to Lashkari et al.

Many additional advantages of the optimization algorithm are apparent. For example, since the optimization algorithm does not use convolution as normally used in root-domain solutions, the total response of the system is also taken into account, including both the zero-state response and also the zero-input response. The optimization algorithm also avoids instability problems by testing the synthesis error energy at each iteration against a preset termination threshold. Accordingly, if the test indicates that the system has become instable, the optimization algorithm is stopped and the last optimized linear prediction coefficients are returned. An adaptive step size may also be used to improve the speed of optimization. In addition, the gradient of the synthesis error energy may also be computed using an iterative algorithm which further improves the computational efficiency of the optimization algorithm. Another advantage of the optimization algorithm is that perceptual weighting may be used to further improve the quality of the synthesized speech.

Figure 4:
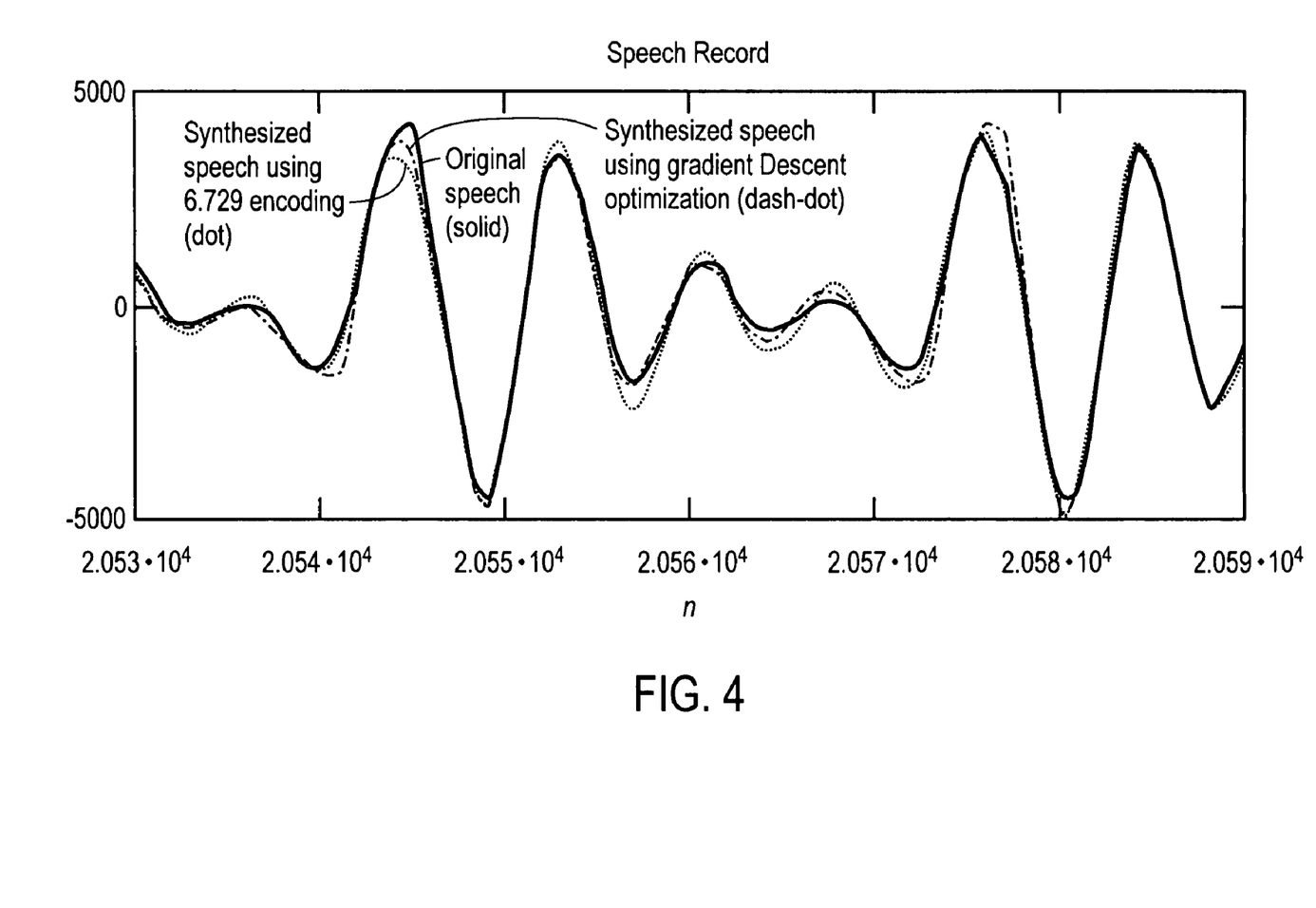
FIG. 4 is a timeline-amplitude chart, comparing an original speech waveform to a synthesized speech waveform using G.729 encoder and a synthesized speech waveform using a G.729 encoder with gradient decent optimization.

FIG. 4 shows an example of the results provided by the optimization algorithm. The figure represents a typical speech waveform and includes the original speech sample, a synthesized speech using a standard G.729 encoder, and a synthesized speech using the G.729 encoder with gradient descent optimization algorithm. As those skilled in the art know, a G.729 encoder is a standardized speech encoder used by researchers and others to compare the quality of various speech encoders. As seen in the chart, the synthesized speech produced by incorporating the gradient descent optimization matches the original speech more closely than the synthesized speech produced by the G.729 encoder alone.

Other test results also demonstrate the improved quality and efficiency of the optimization algorithm. For example, in one test, standardized speech records of male and female speakers were encoded using the standard G.729 encoder with and without optimization algorithms. Using segmental signal to noise ratio ("SSNR") measurements with 10 ms intervals, the G.729 encoder by itself produced a 7.06 dB SSNR, the G.729 encoder with a root-domain optimization algorithm produced a 7.33 dB SSNR, and the G.729 encoder with the described gradient descent optimization algorithm produced a 7.34 dB SSNR. As those in the art recognize, a higher SSNR measurement is normally associated with a higher perceptual quality in the synthesized speech. In addition, the computational load of the gradient descent optimization algorithm is less than with the root-domain optimization algorithm. This previous test was performed without using perceptual weighting. When perceptual weighting is added, the gradient descent optimization algorithm produced a segmental signal to weighted noise ratio ("SSWNR") measurement of 14.19 dB SSWNR compared to 14.04 dB SSWNR for the standard G.729 encoder.

While preferred embodiments of the invention have been described, it should be understood that the invention is not so limited, and modifications may be made without departing from the invention. The scope of the invention is defined by the appended claims, and all devices that come within the meaning of the claims, either literally or by equivalence, are intended to be embraced therein.

We claim:

1. A method of optimizing a synthesized speech comprising
    computing first coefficients of a speech synthesis polynomial using an original speech sample thereby producing a first synthesized speech sample,
    computing a first error between said original speech sample and said first synthesized speech sample, computing a gradient of said first error,
    computing second coefficients of said speech synthesis polynomial using said gradient thereby producing a second synthesized speech sample, wherein said second coefficients are iteratively computed using a step size applied to said gradient, an error being computed at each iteration and said iterations being completed when said error at each iteration is no longer decreasing,
    computing a second error between said original speech sample and said second synthesized speech sample,
    returning said second coefficients if said second error is less than said first error and returning said first coefficients if said second error is more than said first error,
    computing a gradient of said second error,
    computing third coefficients of said speech synthesis polynomial using said second error gradient thereby producing a third synthesized speech sample, wherein said third coefficients are iteratively computed using a step size applied to said second error gradient, an error being computed at each iteration and said iterations being completed when said error at each iteration is no longer decreasing,
    computing a third error between said original speech sample and said third synthesized speech sample, and
    testing said third error for system instability and returning said second coefficients if said test identifies instability.

2. The method according to claim 1, wherein said second coefficients are computed using an adaptive step size applied to said gradient, said adaptive step size being a function of said gradient and said first coefficients.

3. The method according to claim 1, further comprising perceptually weighting said gradient.

4. A method of optimizing a synthesized speech comprising
    computing first coefficients of a speech synthesis polynomial using an original speech sample thereby producing a first synthesized speech sample, computing a first error between said original speech sample and said first synthesized speech sample, computing a gradient of said first error, computing second coefficients of said speech synthesis polynomial using said gradient thereby producing a second synthesized speech sample, wherein said second coefficients are computed using an adaptive step size applied to said gradient, said adaptive step size being a function of said gradient and said first coefficients, wherein said adaptive step size function uses the formula:

$$\mu = \text{Step\_Size} * (\|a\|^2/\|\nabla J\|^2)^{1/2},$$

computing a second error between said original speech sample and said second synthesized speech sample, and returning said second coefficients if said second error is less than said first error and returning said first coefficients if said second error is more than said first error.

5. A method of optimizing a synthesized speech comprising computing first coefficients of a speech synthesis polynomial using an original speech sample thereby producing a first synthesized speech sample, computing a first error between said original speech sample and said first synthesized speech sample, computing a gradient of said first error, computing second coefficients of said speech synthesis polynomial using said gradient thereby producing a second synthesized speech sample, computing a second error between said original speech sample and said second synthesized speech sample, returning said second coefficients if said second error is less than said first error and returning said first coefficients if said second error is more than said first error, and testing said second error for system instability and returning said first coefficients if said test identifies instability.

6. The method according to claim 5, wherein said testing comprises comparing a difference between said second error and said first error and testing whether said difference is greater than a termination threshold.

7. A method of optimizing a synthesized speech comprising computing first coefficients of a speech synthesis polynomial using an original speech sample thereby producing a first synthesized speech sample, computing a first error between said original speech sample and said first synthesized speech sample, computing a gradient of said first error, wherein said gradient is computed using the formula:

$$\frac{\partial J}{\partial a_i} = \sum_{n=0}^{N-1} \frac{\partial}{\partial a_i}(s[n] - \hat{s}[n])^2 = \sum_{n=0}^{N-1} 2(s[n] - \hat{s}[n])\left(-\frac{\partial \hat{s}[n]}{\partial a_i}\right).$$

computing second coefficients of said speech synthesis polynomial using said gradient thereby producing a second synthesized speech sample, computing a second error between said original speech sample and said second synthesized speech sample, and returning said second coefficients if said second error is less than said first error and returning said first coefficients if said second error is more than said first error.

8. The method according to claim 7, wherein said gradient is further computed iteratively with a multi-dimensional array using the formula:

$$D[n, i] = \frac{\partial \hat{s}[n]}{\partial a_i}$$

and the code:

```
For n=1 to N-1
    D[n, i] = -ŝ[n-i]
    For j = 1 to M
        If n-j = 0
            D[n, i] = -a_j * D[n-j, i]
    Next j
Next n.
```

9. A method of optimizing a synthesized speech comprising computing first coefficients of a speech synthesis polynomial using an original speech sample thereby producing a first synthesized speech sample, computing a first error between said original speech sample and said first synthesized speech sample, computing a gradient of said first error, perceptually weighting said gradient, wherein said perceptually weighted gradient uses the formula:

$$\frac{\partial J}{\partial a_i} = \sum_{n=0}^{N-1} \{-2e_w[n](D[n, i] * h_w[n])\}$$

where * is a convolution operators, computing second coefficients of said speech synthesis polynomial using said gradient thereby producing a second synthesized speech sample, computing a second error between said original speech sample and said second synthesized speech sample, and returning said second coefficients if said second error is less than said first error and returning said first coefficients if said second error is more than said first error.

10. A method of optimizing a synthesized speech comprising computing first coefficients of a speech synthesis polynomial using an original speech sample thereby producing a first synthesized speech sample, computing a first error between said original speech sample and said first synthesized speech sample, computing a gradient of said first error, computing second coefficients of said speech synthesis polynomial using said gradient thereby producing a second synthesized speech sample, wherein said second coefficients are iteratively computed using a step size applied to said gradient, an error being computed at each iteration and said iterations being completed when said error at each iteration is no longer decreasing; further comprising testing said second error for system instability and returning said first coefficients if said test identifies instability; and further comprising perceptually weighting said gradients, computing a second error between said original speech sample and said second synthesized speech sample, and returning said second coefficients if said second error is less than said first error and returning said first coefficients if said second error is more than said first error.

11. The method according to claim 10, further comprising computing a gradient of said second error, computing third coefficients of said speech synthesis polynomial using said second error gradient thereby producing a third synthesized speech sample, wherein said third coefficients are iteratively computed using a step size applied to said second error gradient, an error being computed at each iteration and said iterations being completed when said error at each iteration is no longer decreasing, computing a third error between said original speech sample and said third synthesized speech sample, and testing said third error for system instability and returning said second coefficients if said test identifies instability; wherein said second coefficients are computed using an adaptive step size applied to said gradient, said adaptive step size being a function of said gradient and said first coefficients; wherein said testing comprises comparing a difference between said second error and said first error and testing whether said difference is greater than a termination threshold; wherein said perceptually weighted gradient uses the formula:

$$\frac{\partial J}{\partial a_i} = \sum_{n=0}^{N-1} \{-2e_w[n](D[n,i] * h_w[n])\};$$

and wherein said gradient is further computed iteratively with a multi-dimensional array using the formula:

$$D[n,i] = \frac{\partial \hat{s}[n]}{\partial a_i}$$

and the code:

```
For n=1 to N-1
    D[n, i] = -ŝ[n-i]
    For j = 1 to M
        If n-j = 0
            D[n, j] = -a_j * D[n-j, i]
    Next j
Next n.
```

12. A method of generating a speech synthesis filter comprising
generating a first synthesized speech,
computing a first error energy based on said first synthesized speech,
computing an error energy gradient based on said first error energy without converting to a root-domain, wherein said error energy gradient is computed directly from a system difference equation without using a convolution relation between an input signal and a system impulse response, generating a second synthesized speech using said error energy gradient, wherein said second synthesized speech is generated by iteratively searching a minimum second error energy based on said second synthesized speech, and testing said second synthesized speech for system instability and returning said first synthesized speech if said test identifies instability.

13. The method according to claim 12, wherein said error energy gradient is computed directly from a system difference equation without using a convolution relation between an input signal and a system impulse response.

14. The method according to claim 13, wherein said second synthesized speech is generated by iteratively searching a minimum second error energy based on said second synthesized speech.

15. The method according to claim 14, wherein said second synthesized speech is computed using an adaptive step size applied to said error energy gradient, said adaptive step size being a function of said error energy gradient and said first synthesized speech.

16. The method according to claim 12, wherein said error energy gradient is computed using the formula:

$$\frac{\partial J}{\partial a_i} = \sum_{n=0}^{N-1} \frac{\partial}{\partial a_i}(s[n]-\hat{s}[n])^2 = \sum_{n=0}^{N-1} 2(s[n]-\hat{s}[n])\left(-\frac{\partial \hat{s}[n]}{\partial a_i}\right).$$

17. A speech optimization algorithm comprising means for computing first linear prediction coefficients, means for computing an error energy gradient directly from a system difference equation without converting said first linear prediction coefficients into a root-domain, means for computing second linear prediction coefficients from said error energy gradient, means for comparing said error energy of said first and second linear prediction coefficients, means for returning said first or second linear prediction coefficients having a lower error energy, and means for testing said second linear prediction coefficients for system instability.

18. The speech optimization algorithm according to claim 17, further comprising means for adaptively computing said second linear prediction coefficients.

19. The speech optimization algorithm according to claim 17, means for perceptually weighting said error energy gradient.

* * * * *

UNITED STATES PATENT AND TRADEMARK OFFICE
CERTIFICATE OF CORRECTION

PATENT NO. : 7,200,552 B1
APPLICATION NO. : 10/134281
DATED : April 10, 2007
INVENTOR(S) : Angelo et al.

It is certified that error appears in the above-identified patent and that said Letters Patent is hereby corrected as shown below:

Title page, Item (12) and (75) delete "Angel et al." replace with --Angelo et al.--.

Signed and Sealed this

Seventeenth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,200,552 B2  
APPLICATION NO. : 10/134281  
DATED : April 3, 2007  
INVENTOR(S) : Wai C. Chu

Page 1 of 1

It is certified that error appears in the above-identified patent and that said Letters Patent is hereby corrected as shown below:

This certificate supersedes the Certificate of Correction issued June 17, 2008. The certificate should be vacated since no Certificate of Correction was granted for this patent number.

Signed and Sealed this

Fifth Day of August, 2008

JON W. DUDAS  
*Director of the United States Patent and Trademark Office*